US009431552B2

(12) United States Patent
Li et al.

(10) Patent No.: US 9,431,552 B2
(45) Date of Patent: Aug. 30, 2016

(54) METALLIZATION PASTE FOR SOLAR CELLS

(71) Applicant: Sichuan Yinhe Chemical Co., Ltd., Mianyang, Sichuan Province (CN)

(72) Inventors: Yunjun Li, Austin, TX (US); James P. Novak, Austin, TX (US); Patrick Paul Ferguson, Austin, TX (US); Mohshi Yang, Austin, TX (US)

(73) Assignee: Starsource Scientific LLC, Austin, TX (US)

( * ) Notice: Subject to any disclaimer, the term of this patent is extended or adjusted under 35 U.S.C. 154(b) by 0 days.

(21) Appl. No.: 14/380,611

(22) PCT Filed: Feb. 25, 2013

(86) PCT No.: PCT/US2013/027564
§ 371 (c)(1),
(2) Date: Aug. 22, 2014

(87) PCT Pub. No.: WO2013/126865
PCT Pub. Date: Aug. 29, 2013

(65) Prior Publication Data
US 2015/0303323 A1  Oct. 22, 2015

Related U.S. Application Data

(60) Provisional application No. 61/602,802, filed on Feb. 24, 2012.

(51) Int. Cl.
*H01L 31/0224* (2006.01)
*B82Y 30/00* (2011.01)

(52) U.S. Cl.
CPC ........ *H01L 31/022425* (2013.01); *B82Y 30/00* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 2006/0081311 A1* | 4/2006 | Tsao | ...................... | C22C 21/02 148/415 |
| 2009/0025786 A1* | 1/2009 | Rohatgi | .......... | H01L 31/022425 136/256 |
| 2009/0101190 A1* | 4/2009 | Salami | .................... | C03C 3/062 136/244 |
| 2009/0301559 A1* | 12/2009 | Rohatgi | ............ | H01L 31/02167 136/256 |
| 2009/0325327 A1* | 12/2009 | Rohatgi | ............ | H01L 31/02242 438/17 |

(Continued)

FOREIGN PATENT DOCUMENTS

| | | |
|---|---|---|
| JP | 62-009680 A | 1/1987 |
| JP | 2001313402 A | 11/2001 |

(Continued)

OTHER PUBLICATIONS

Kobayashi_et_al (English machine translation of JP 2010123999 A, Pubn-Date: Jun. 3, 2010).*

(Continued)

*Primary Examiner* — Khaja Ahmad
(74) *Attorney, Agent, or Firm* — Platinum Intellectual Property LLP

(57) ABSTRACT

A metallization paste or ink for making electrical contacts on solar cells has reduced diffusion in a silicon wafer. The paste or ink is configured for printing on a crystalline silicon substrate of a solar cell, wherein the paste comprises silicon particles, aluminum particles, and a paste vehicle. Alternatively, the paste comprises aluminum-silicon alloy particles.

20 Claims, 17 Drawing Sheets

(56) References Cited

U.S. PATENT DOCUMENTS

| | | | |
|---|---|---|---|
| 2011/0217809 A1* | 9/2011 | Li | C09D 11/36 438/72 |
| 2012/0037224 A1* | 2/2012 | Fujikawa | H01L 31/022425 136/256 |
| 2012/0048366 A1* | 3/2012 | Mai | H01L 21/2254 136/256 |

FOREIGN PATENT DOCUMENTS

| | | | |
|---|---|---|---|
| JP | 2010123999 A * | 3/2010 | H01L 31/04 |
| JP | 2010123999 A | 6/2010 | |
| RU | 2303831 C2 | 7/2007 | |

OTHER PUBLICATIONS

Russia International Searching Authority; International Search Report & Written Opinion of the International Searching Authority for PCT/US2013/027564; Jun. 20, 2013; Berezhkovskaya nab; RU.

* cited by examiner

METALLIZATION PASTE FOR SOLAR CELLS

This application claims priority to U.S. Provisional Patent Application Ser. No. 61/602,802, which is hereby incorporated by reference herein.

TECHNICAL FIELD

The present invention relates in general to solar cells, and in particular, to conductive contacts for solar cells.

DETAILED DESCRIPTION OF THE DRAWINGS

Figure 1:
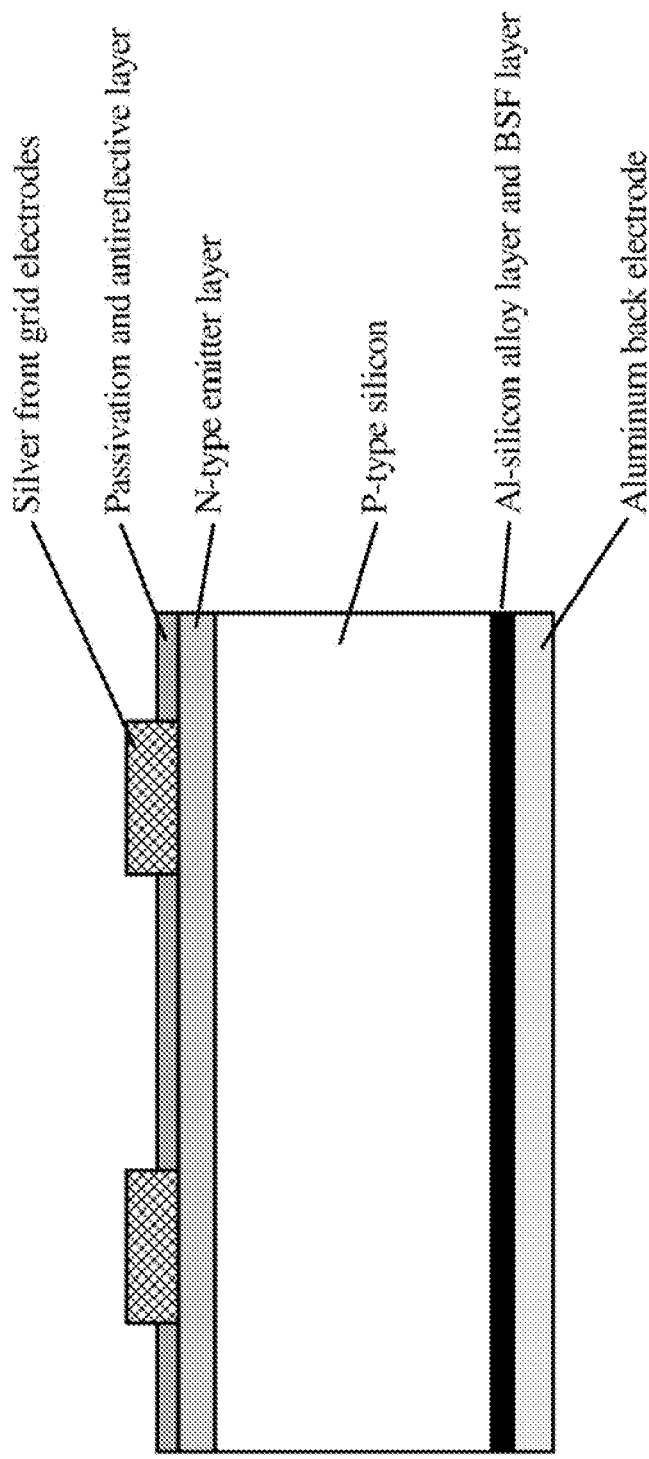
FIG. 1 illustrates a cross-section of a portion of a solar cell.

Referring to FIG. 1, metal paste materials may be utilized to form the electrical contacts on the top, or front, and back, or rear, sides of silicon ("Si") solar cells. Aluminum ("Al") may be used for the p-doped side of the silicon, and silver may be used for the n-doped silicon, wherein the p-doped side is the back side of the wafer, and the n-doped side is the top side of the wafer. This structure is referred to as a p-type solar cell.

This solar cell structure has dimensional limitations on the diffusion profile. For example, manufacturing of the overall wafer begins with a p-type diffusion. This doping type penetrates the entire water. To create the diode junction, only a shallow region (less than 1 micron) is n-doped. After the diode junction is created by the interface between the p- and n-doped regions, the respective sides are metallized to collect the electron—hole pairs generated by the photovoltaic effect.

Figure 2:
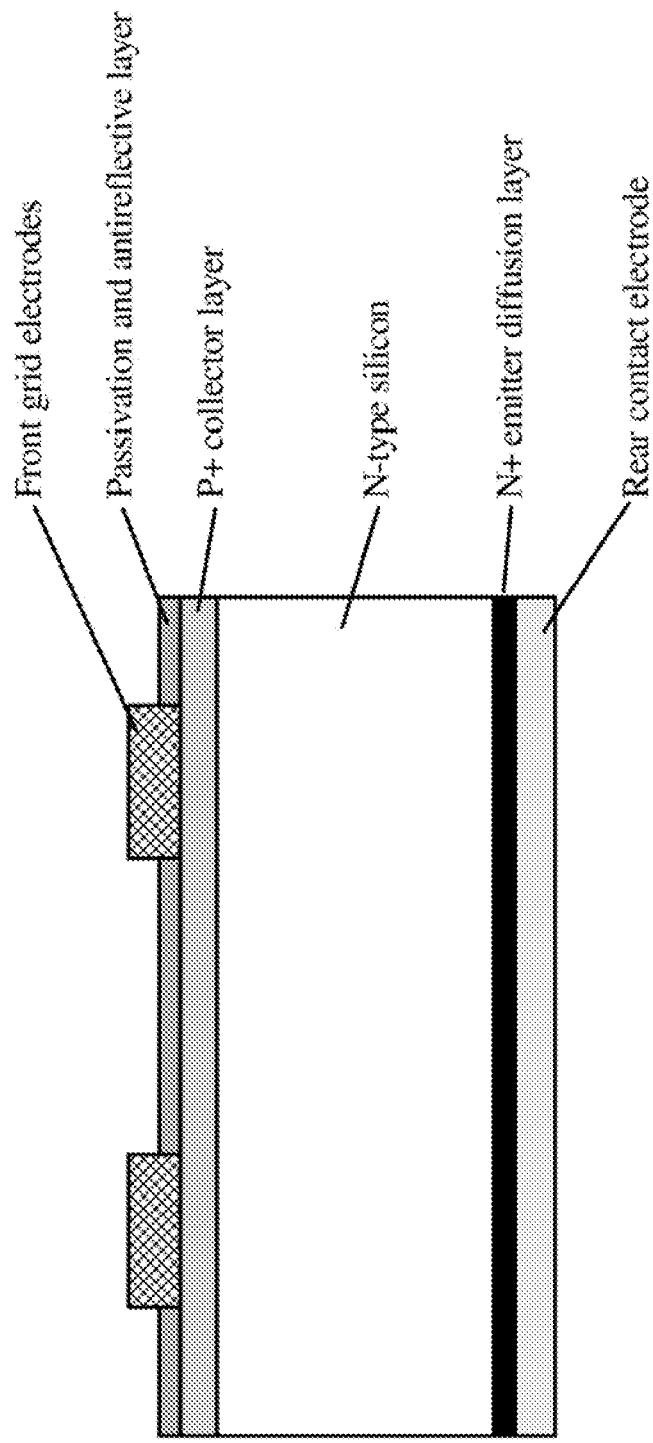
FIG. 2 illustrates a cross-section of a portion of ail alternative structure of a solar cell.

Referring to FIG. 2, additional structures for more advanced solar cells include inverted n-type wafers. These structures begin with n-type silicon wafers. The collector layer is diffused into the top of the solar cell (p+), and the emitter layer is diffused into the bottom of the solar cell (n+). The dopants may be boron for the p+ region and phosphorous for the n+ region. The n-type solar cell is generally more efficient than the p-type (see FIG. 1) due to increased carrier lifetime of the more conductive n-type silicon.

A challenge with the manufacture of n-type solar cells is making a reliable contact to the n+ side of the cell. Silver is commonly used for the n-type top-contact on p-type cells (see FIG. 1.) However, the backside of the n-type cell in FIG. 2 is a global (larger area) contact. Therefore, the use of silver is too expensive to be considered a viable method for metallization of this rear contact electrode on n-type solar cells.

Embodiments of the present invention utilize a metallization paste that can form a low-resistivity contact with both n-type and p-type silicon.

Figure 3:
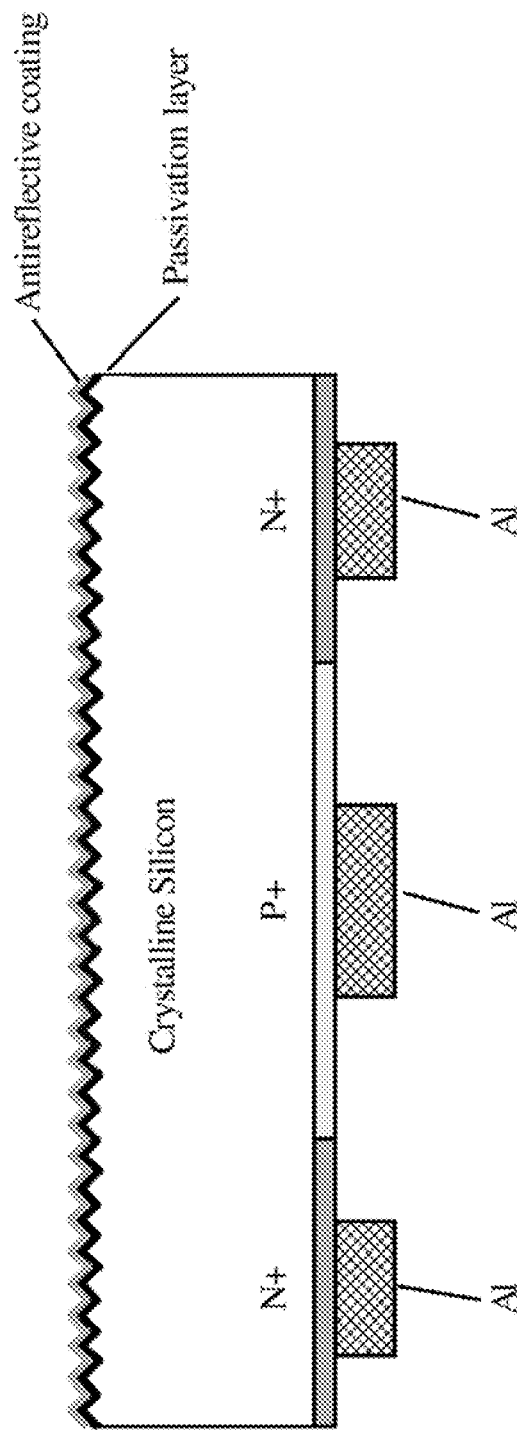
FIG. 3 illustrates a cross-section of a portion of a solar cell with an interdigitated backside contact.

Other cell structures that benefit from using one metal as both an n+ and p+ contact are interdigitated backside contact ("IBC") cells. FIG. 3 illustrates a portion of such an interdigitated backside contact cell. The backside of the solar cell has alternating n+ and p+ regions in a specific pattern. The paste described in this disclosure makes low resistivity contacts to both regions on the wafer. This enables this type of cell to be manufactured with a single printing step that saves time and reduces cost. Currently, manufacturers use vacuum-based techniques to deposit metals onto IBC style cells. The ability to directly print the metallization layer represents significant cost savings.

Metallization layers may be applied to a surface with various methods, such as vacuum-based procedures e.g., physical vapor deposition ("PVD") or chemical vapor deposition. ("CVD")). Such vacuum-based techniques are expensive yet provide excellent uniformity and electrical performance. Alternatively, metalization layers may be applied using as printed method such as direct screen printing. Other printing methods may be used, such as inkjet printing, spray printing, and/or aerosolized jet printing. Each of these printing procedures utilizes specially formulated ink or paste materials. A paste or ink material may be comprised of metal particles, inorganic components, solvents, dispersants, and/or vehicles components. Each these components may vary in total percentage of the composition and may be tailored to achieve different functions from dispersion quality, control over viscosity, control of surface tension, and, but not limited to, control over surface energy and spreading.

In embodiments of the present invention, as metallization paste or ink is made that has reduced diffusion in a silicon wafer. Generally, the difference between a paste and ink is the viscosity. A low viscosity material (i.e., viscosity less than approximately 1000 cP) is considered an ink, while a high viscosity material (i.e., viscosity greater that approximately 1000 cP) is considered a paste. In embodiments of the present invention, though pastes are described, alternatively the formulations may be in inks: primarily it is the vehicle that is modified to alter the viscosities.

There are several steps to process the printed metallization material to become an integral part of the solar cell. After placing the metallization material onto the silicon wafer, the material may be dried to remove any residual solvents and prevent further spreading. After the drying step, the metallization paste is fired (heated to a high temperature), which may further remove volatile additives. This firing functions to sinter the particles into a continuous film and diffuse the metal into the silicon forming a good ohmic electrical contact. Each type of metallization layer may have different requirements depending on the cell structure or architecture.

Figure 14A:
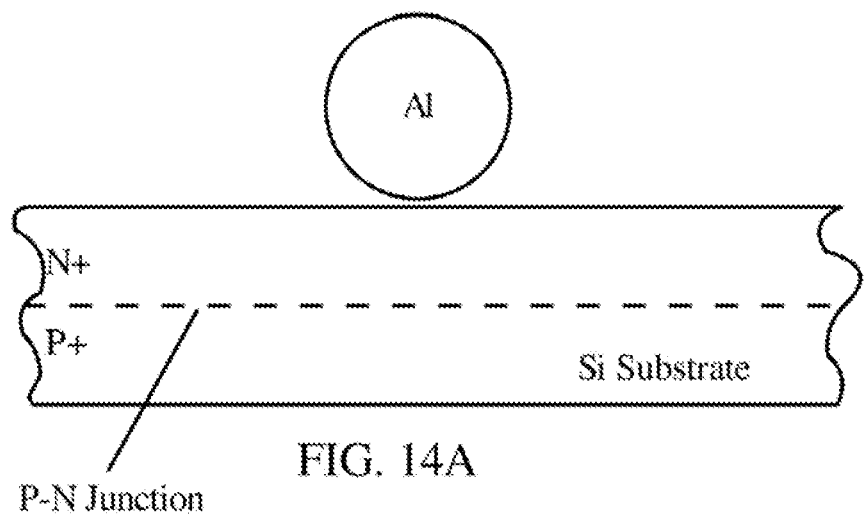
FIGS. 14A-14C illustrate schematics showing a deep diffusion of aluminum through the P-N junction in a silicon substrate.
Figure 14B:
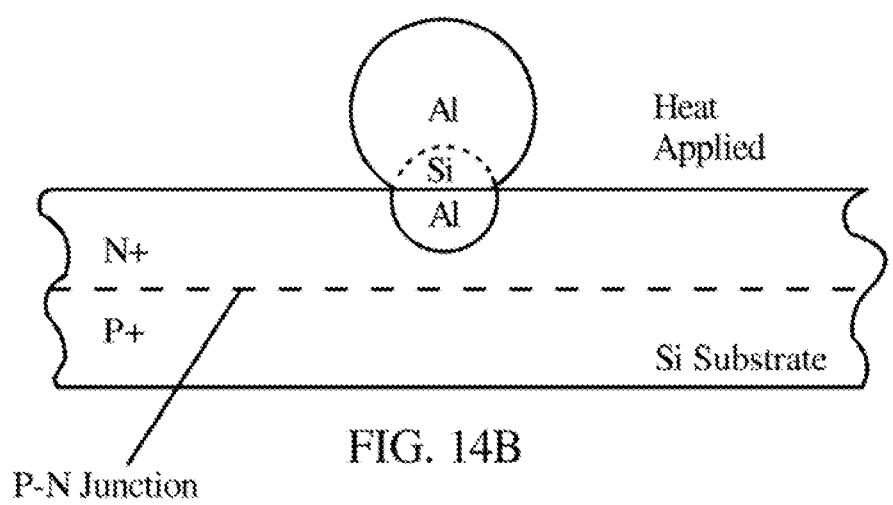
Figure 14C:
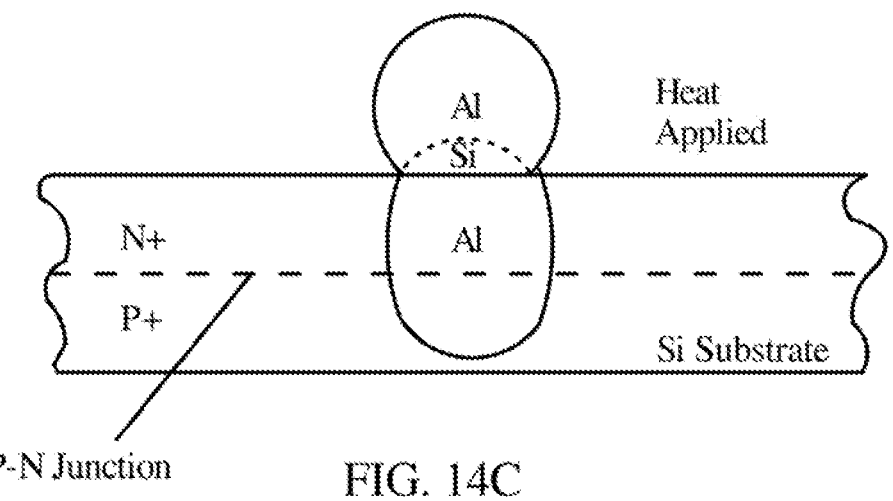

A challenge tier use with such the metallization materials is to achieve optimal electrical performance (measured by contact resistivity and sheet resistance) with minimal diffusion depth. This is problematic due to the high firing temperatures required of the metal pastes, which generate very high diffusion rates between the metal and the silicon. The higher the temperature a solar cell is fired and the longer the time it is fired, the higher probability that the metal diffuses across the p-n junction within the solar cell, which lowers the efficiency of the solar cell. Referring to FIGS. 14A-14C, there is schematically illustrated how such a deep diffusion of the metal into the silicon can significantly lower the efficiency of solar cell. FIG. 14A illustrates an exemplary aluminum particle that has been deposited onto a silicon substrate, such as for example in the form of a metallization ink, or paste. Referring to FIG. 14B, after heat is applied, the interface between the silicon and the aluminum particle is not stable, and the silicon begins to diffuse from the substrate into the aluminum particle, while the aluminum begins to diffuse from the particle into the silicon substrate. This forms the aluminum-silicon alloy at this interface. Referring to FIG. 14C, the volume of the aluminum particle is small; therefore, little of the silicon diffuses into the aluminum particle to stabilize its structure. Conversely, the volume of the substrate is large. Therefore, more of the aluminum diffuses into the substrate from the particle. With application of a sufficient temperature over a sufficient amount of time, the aluminum will diffuse through the silicon substrate and across the diffusion depth profile, or doping layer (also referred to as the p-n junction). As a result, the conductivity of the diffused aluminum forms a direct shunt cross the p-n junction.

The doping profile in a solar cell dictates the limitations on diffusion. In a p-type solar cell (e.g., see FIG. 1), aluminum may be used as the back electrode. When fired, the aluminum diffuses into the p-type silicon (and silicon diffuses into the aluminum layer) creating an aluminum-silicon alloy layer and a back-surface field ("BSF") region, where the concentration of aluminum reduces forming a gradient into the silicon. The alloy region may be approximately 5-10 microns deep, and the BSF layer may be as much as 8 microns deep depending on the firing temperature and time. This diffusion process creates excellent adhesion of the back electrode to the silicon substrate and very low contact resistivity, both of which are desirable for a high performance solar cell.

The depth of diffusion is not limited by the junction. In the case of a backside aluminum electrode contact, the aluminum would have to diffuse through the entire thickness of the wafer to create a problem by shunting the junction.

A p-type solar cell has a silver metallic contact on the top side for the front grid electrodes. The top side of the solar cell has a shallow region that is doped n-type the n-type emitter layer). The silver material is deposited directly on top of a silicon nitride layer. The nitride layer serves as a passivation and anti-reflective layer to protect the solar cell and trap more light, respectively. An issue with firing this type of solar cell is that the top layer of silver must be fired at a high temperature such that a reaction between glass-frit additives in the silver paste and the silicon nitride can occur creating a diffusion channel for the silver metal to make contact with the silicon. If the temperature is too low, no reaction with the nitride will occur and no contact will be formed. If the temperature is too high, the contact will be formed but the metal will diffuse rapidly through the n-type emitter layer at the top of the solar cell. The relative rate steps for the reaction kinetics are very different. Empirically, the reaction between the glass fit and the nitride is relatively slow. Once the reaction has occurred, the diffusion of the silver into the silicon is relatively fast, and when the metal passes the p-n interface junction, the resultant solar cell will suffer from poor performance. It is thus desirable to have the reaction with the nitride occur, the silver to diffuse through the nitride and make contact with the silicon, and then the wafer cooled down to prevent further diffusion of the silver into the silicon.

Processing of aluminum electrical contacts electrodes) evaporated onto silicon using vacuum techniques on silicon may be performed in a solid-phase. Low temperature processing may be used to anneal the aluminum and create a contact with the surface without diffusion. However, such a process cannot be performed with printed metallization layers because printed inks and pastes utilize a sintering step that occurs at a temperature higher than the annealing temperature of a vacuum deposited film. Embodiments of the present invention described herein utilize an ink or paste formulation configured tier low temperature firing to form aluminum contacts on silicon to produce high performance solar cells.

The particle size of the aluminum is important. The aluminum paste of embodiments of the present invention is comprised of primarily sub-micron particles (e.g., less than 3 microns and preferably below 1 micron). The smaller particles lower the required sintering temperature and have different diffusion properties compared with the larger particles.

In embodiments, aluminum particles of a sufficiently small size are used to reduce the melting point of the deposited metal film below the melting point of bulk aluminum. As a result, the paste can then be fired below 660° C., the bulk melting point of aluminum, and become conductive.

In embodiments, the smaller particles are added to aluminum to shift the diffusion gradient of aluminum into silicon. This may be used on the p-side of a silicon wafer to increase diffusion uniformity.

In embodiments, the smaller aluminum particles may be printed on the n-side of a wafer. The smaller particles accomplish two functions. First, the smaller aluminum particles create a uniform surface coverage. Second, the smaller particles have reduced mass, which reduces the mass-based diffusion constants and slows diffusion upon exposure to high temperature. This creates a simulation of an evaporated film. Combined with the lowered process temperature related to the particles size (described above), this provides a unique control, over the diffusion depth and uniformity of the contact interface between silicon and aluminum.

When using these embodiments, the silicon may be additionally doped. These doping structures create boundary conditions whereby the use of merely aluminum is not possible for the creation of a quality contact. The diffusion of aluminum can be rapid and cause spiking and/or pitting in the silicon surface. Spiking occurs when rapid diffusion of aluminum (or other metal) occurs in a highly localized region(s) of the silicon. In this case, an aluminum alloy may be used to control diffusion into the silicon.

Embodiments of the present invention control diffusion by doping the metallization material with additives that shift the equilibrium. Additional additives may be included that change the diffusion rate. Modern high-efficiency solar cells have low doping concentrations in the n-type regions. This low doping (e.g., of phosphorus) creates high-resistivity silicon. The low concentration means that the doping depth of penetration is very shallow in comparison to high doping concentrations. There then exists an issue where metallization on the silicon diffuses past these shallow doping levels and effectively shorts the solar cell. Proper control over additives within the metallization materials controls the counter doping of the solar cell as well as the diffusion rate.

Figure 4:
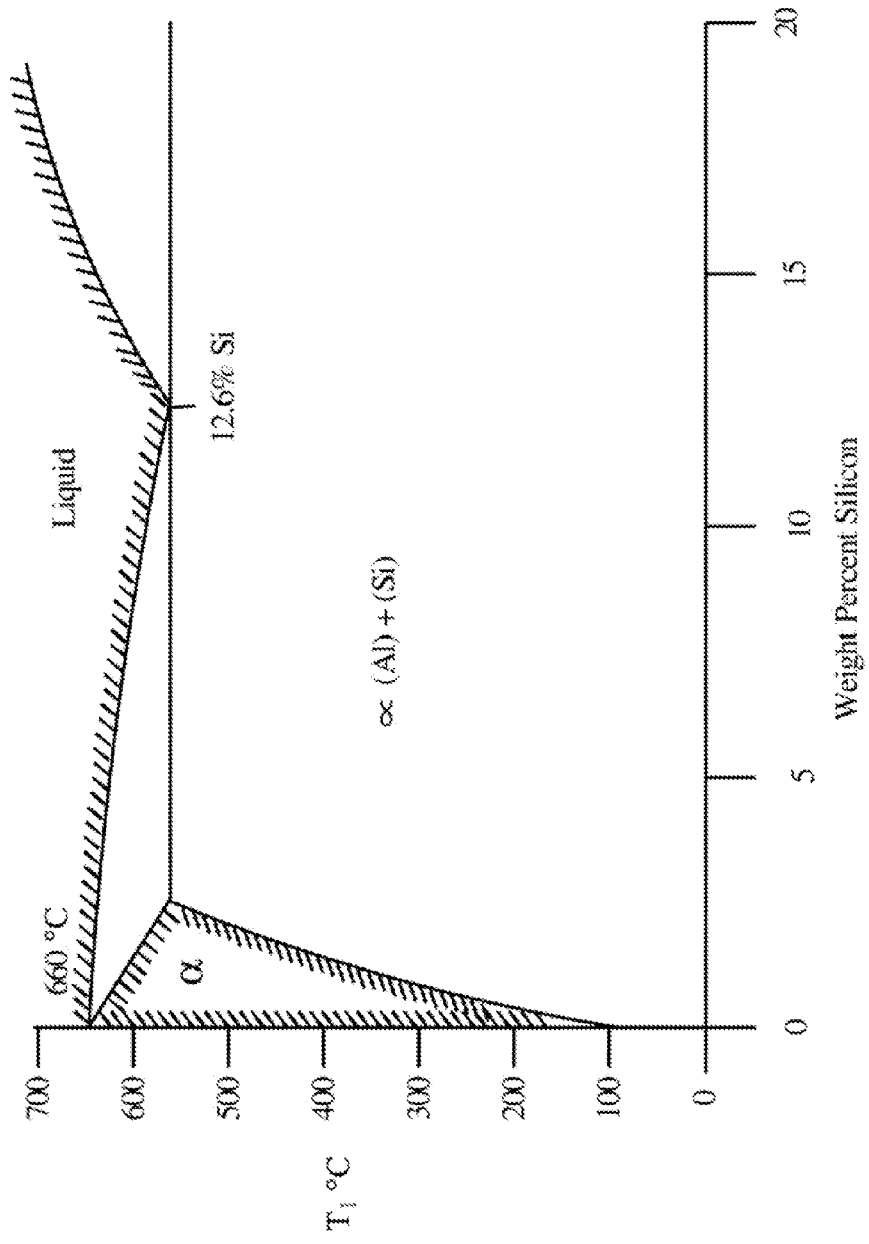
FIG. 4 illustrates a graph showing the aluminum-silicon eutectic point.

Referring to FIG. 4, the aluminum-silicon eutectic point (of, relating to, or formed at the lowest possible temperature of solidification for any mixture of specified constituents; used especially of an alloy whose inciting point is lower than that of any other alloy composed of the same constituents in different proportions) is 577° C. At this temperature, the total silicon content is a maximum 12.6%. Above the eutectic temperature, the aluminum will uptake silicon to stabilize its chemical structure. If the temperature is raised to a point where melting occurs, rapid diffusion of aluminum into silicon occurs. It is desirable to stay below the melting point in an effort to control the diffusion. This process can happen below the liquid-solid transition. The mechanism of silicon uptake is described by the diffusion of silicon atoms into the aluminum structure. To account for the spatial loss of the silicon atoms from the wafer, aluminum atoms diffuse down to replace the missing silicon atoms. This creates a multi-layer interface where the layers are silicon, a diffused region of aluminum, aluminum-rich silicon, silicon-rich aluminum, a diffused silicon in aluminum, and then aluminum. It is the diffused region of aluminum that creates an issue with photovoltaic cells, since the diffused region of aluminum has the deepest diffusion depth into the silicon. This diffusion depth can, in most cases, exceed the depth of silicon doping that defines the photovoltaic junction.

In embodiments of the present invention, silicon is added to the aluminum to shift the operational point relative to the phase diagram such that minimal diffusion of aluminum occurs. The shift in weight percentage of silicon in the aluminum raises the melting temperature as it moves from the eutectic saturation point. This means that for a given temperature, one can decrease diffusion as one moves farther away from the melting point.

In embodiments, silicon particles are added to an aluminum paste. The added particles may be nanoparticles with a diameter less than 250 nm, more preferably less than 100 nm. Nanoparticles of silicon, in combination with micron-sized aluminum powders, create a size distribution where the smaller particles pack within the voids created by the larger particles. This increases silicon contact to the base substrate. The nanoparticles have a high surface area and are more reactive than the bulk silicon in the wafer. The nanoparticles also have a lower melting point than the bulk silicon. As the wafer is fired (heated) to sinter the metallization layer, the silicon particles react with the aluminum particles, stabilizing their structure and preventing them from creating as significant uptake of silicon from the substrate. The silicon nanoparticles are more reactive than the bulk silicon wafer due to their smaller size. Therefore, the silicon nanoparticles preferentially react with the aluminum particles before the aluminum particles can react with the bulk silicon wafer. Without the addition of the silicon particles, the aluminum particles would attack and react with the bulk silicon substrate. Because the particles have a spherical (or substantially spherical) shape they have a relatively small contact area with the silicon compared to their overall outer diameter. This contact patch creates a localized diffusion where rapid mass transfer of aluminum from the particle into the silicon can occur. This rapid diffusion creates a very high local concentration of aluminum known as spiking. In the presence of silicon nanoparticles, the aluminum particles react with the silicon particles prior to reaction with the silicon substrate. This is because the energy threshold for diffusion is reached at a lower temperature with the particles compared to the bulk substrate. This inhibits the spiking or localized diffusion in the silicon substrate.

Figure 5:
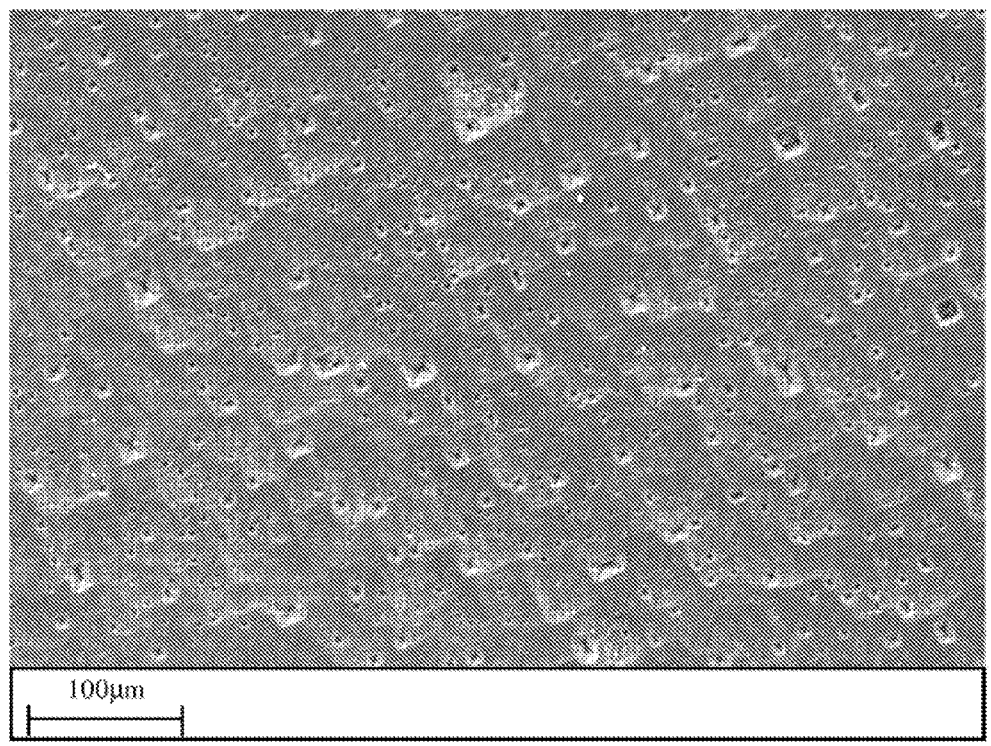
FIG. 5 is a digital image showing aluminum-induced pitting in silicon.

In a controlled experiment, aluminum paste was printed on a crystalline silicon substrate and fired in a furnace at approximately 550° C. After firing, the aluminum layer was removed using a chemical etchant. A small sample of the wafer was cleaved from the bulk wafer. The sample was immersed in an acidic aluminum etching solution (e.g., comprised of phosphoric and nitric acid) until the film was dissolved. The sample was then rinsed with copious amounts of high purity water and dried with a stream of dry nitrogen. The sample was imaged using a high powered optical microscope and also within a scanning electron microscope. Referring to FIG. 5, even at this sub-eutectic temperature (550°), significant pitting was observed. The pits are the rectangular, angular depressions visible in the image. The pitting was due to the uptake of silicon into the aluminum layer. As previously described, this process creates a multi-layer interface after firing in which the layers are silicon, a diffused region of aluminum, aluminum-rich silicon, silicon-rich aluminum, a diffused silicon in aluminum, and then aluminum. The chemical etching of aluminum removes the aluminum, the diffused silicon in aluminum layers, and partially the silicon-rich aluminum layer. It is the removal of the silicon-rich aluminum layer that enables the surface pitting to be visible.

The aluminum-induced pitting in the silicon was significant due to the diffusion of the aluminum into the silicon. The pits showed a rectangular shape that matches the crystal orientation of the base silicon substrate (see FIG. 5). The pitting was a direct result of aluminum reaction with silicon during the firing process.

Figure 6:
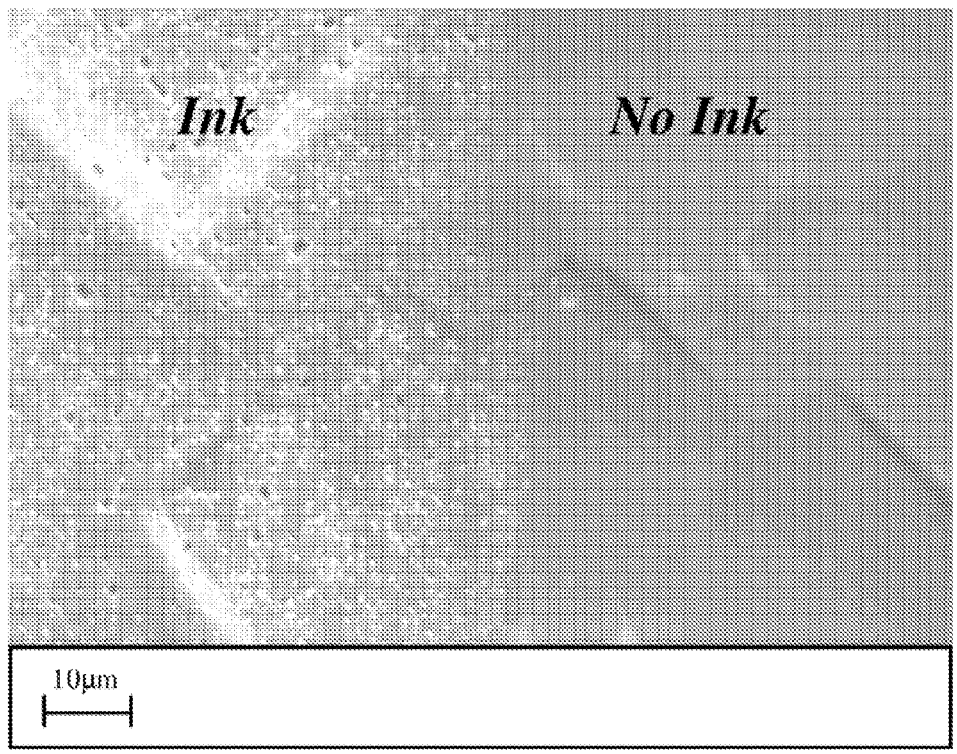
FIG. 6 is a digital image showing how aluminum reacting with silicon during a firing process results in pits.

FIG. 6 shows another controlled experiment whereby the aluminum paste was printed on a crystalline silicon substrate with a pattern (with an area of the substrate printed with the aluminum paste and another area not printed with the aluminum paste) and fired at 550° C. The area that was printed with the aluminum paste was pitted; the area that was not printed with the aluminum paste had no pits.

In additional experiments, the same aluminum paste composition was doped with silicon nanoparticles (i.e., silicon particles added).

Figure 7A:
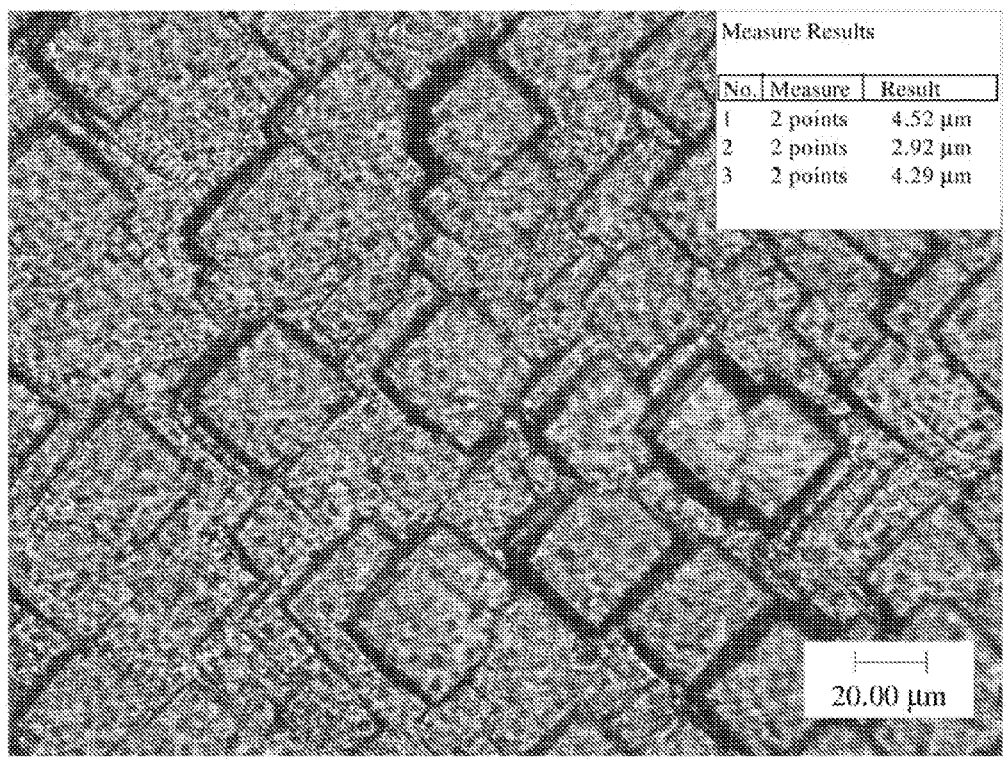
FIGS. 7A-10 are digital images showing degrees of pitting of a silicon surface from aluminum paste having various concentrations of silicon particles.
Figure 7B:
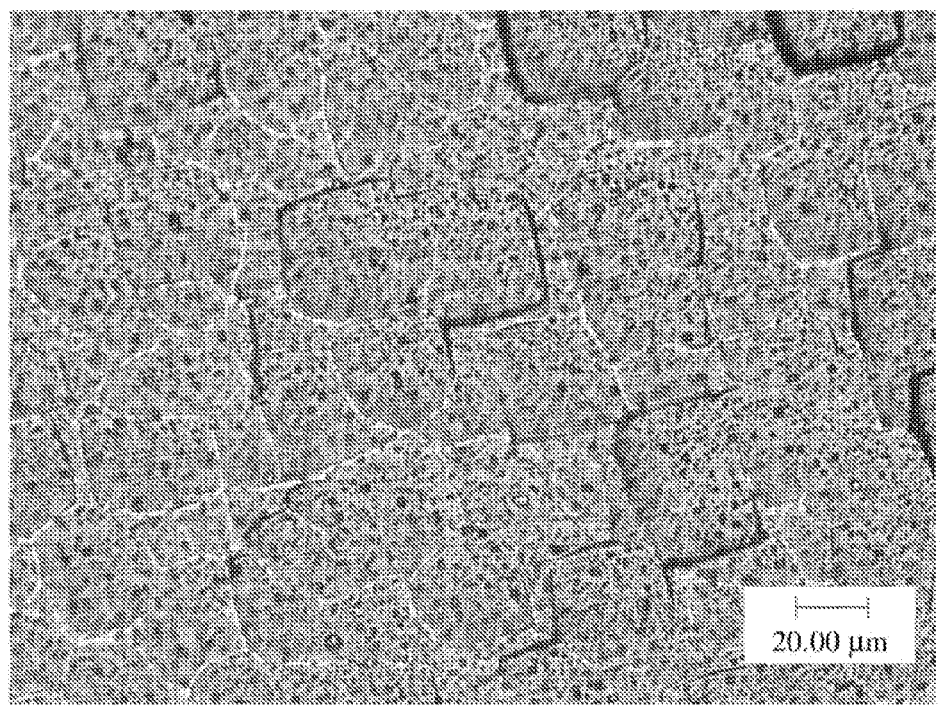
Figure 8A:
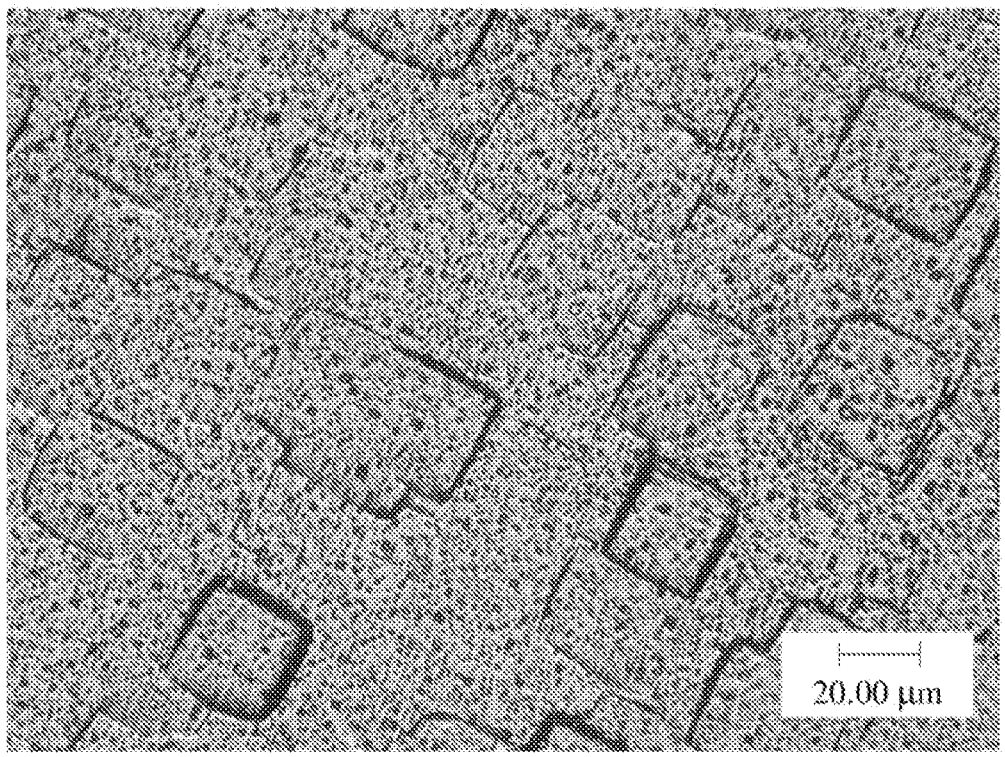
Figure 8B:
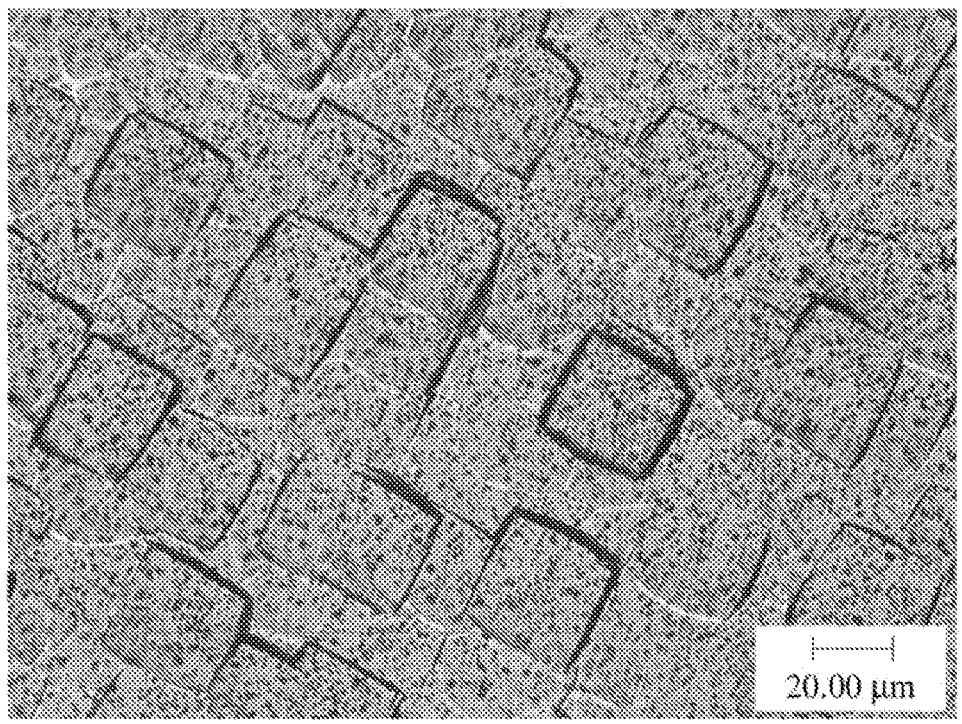
Figure 9:
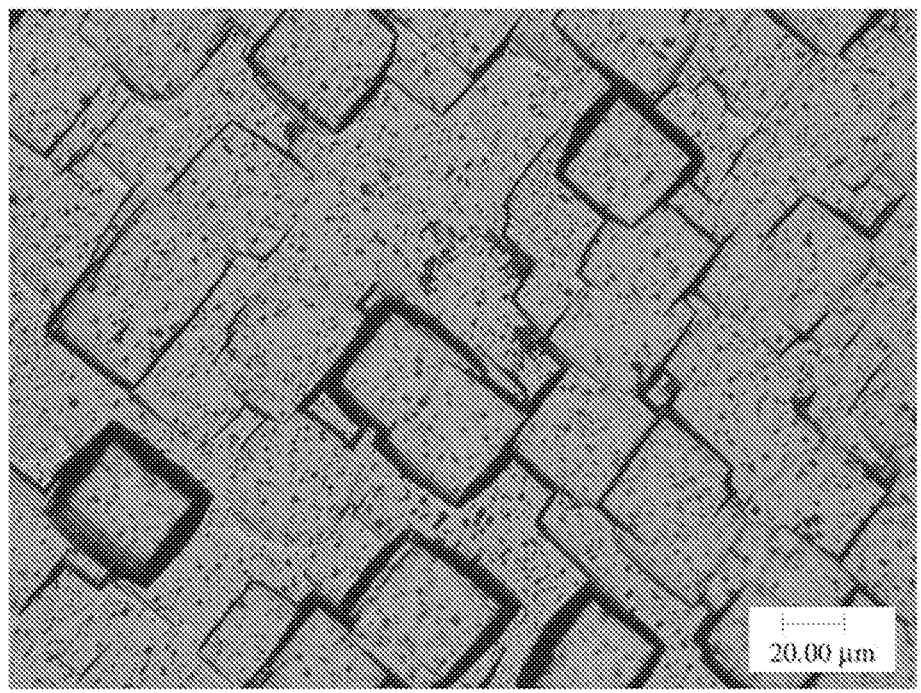
Figure 10:
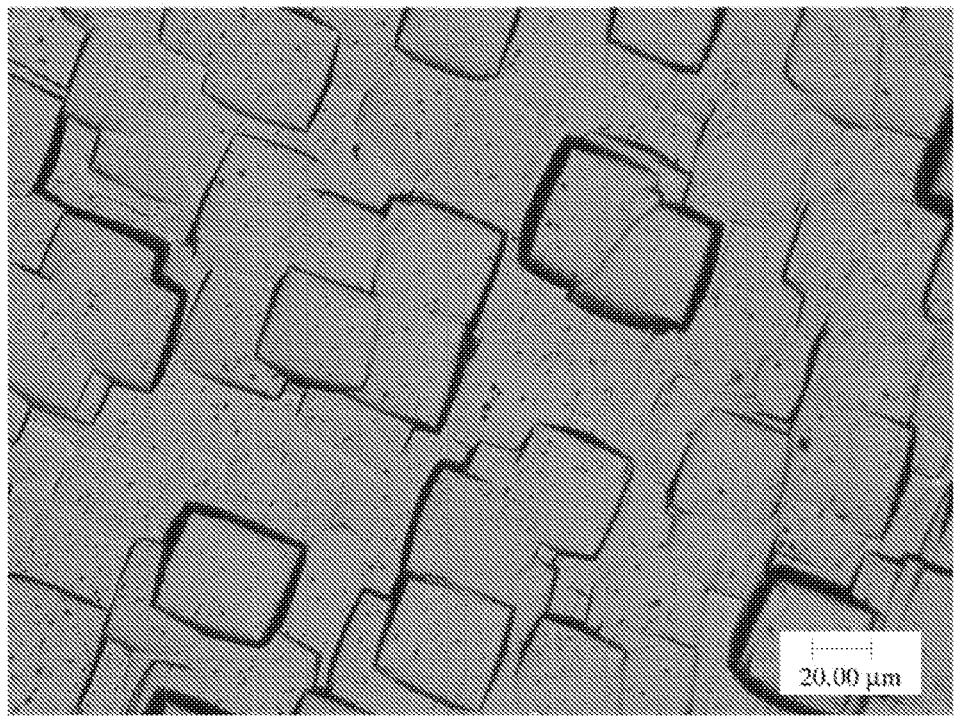

Experiment Parameters were:
Three weight loading concentrations of silicon nanoparticles, Si—2%, Si—4%, and Si—12% (all approximate), were formulated into Al pastes.
Two additional pastes were formulated with 30% and 50% Si particles (percentages approximated).
All pastes were printed onto crystalline silicon substrates (wafers).
All the samples were fired at approximately 550° C. for approximately 20 minutes.
After firing, the aluminum layers were etched from the surfaces. Small samples of the wafers were cleaved from the bulk wafers. The samples were immersed in an acidic aluminum etching solution (e.g., comprised of phosphoric and nitric acid) until the films were dissolved. The samples were then rinsed with copious amounts of high purity water and dried with a stream of dry nitrogen.
The samples with the various concentrations of silicon were imaged to compare their respective densities of surface pitting. This comparison was completed using an optical microscope. FIGS. 7A, 7B, 8A, 8B, 9, and 10 show images of the surfaces after etching the pastes in the foregoing samples. FIG. 7A shows a digital image of the surface of the silicon substrate printed with an aluminum paste that had no added silicon particles, which shows significant pitting of the surface. FIG. 7B shows a digital image of a silicon surface printed with an aluminum paste having a weight loading concentration of silicon particles of approximately 2%, which also shows pitting. FIG. 8A shows a digital image of a silicon surface printed with an aluminum paste having a weight loading concentration of silicon particles of approximately 4%, which also shows pitting. FIG. 8B shows a digital image of a silicon surface that had been printed with an aluminum paste with the weight loading concentration of silicon particles of approximately 12%, showing a reduced amount of pitting of the surface. FIG. 9 shows a digital image of a silicon surface that had been printed with an aluminum paste formulated with a weight loading concentration of approximately 30% silicon particles, which shows a surface with greatly reduced pitting. FIG. 10 shows a digital image of a silicon surface that had been printed with an aluminum paste formulated with a weight loading concentration of approximately 50% silicon particles, showing how the pitting has been nearly eliminated.

Pitting occurred in all of the prepared samples, but there was little difference in pitting density when the concentration of silicon was less than 12%. When the concentration of silicon was approximately 12% there was a slight reduction in pitting. Recall from FIG. 4 that the eutectic point of silicon was 12.6%. Therefore, it was expected that, as the concentration of silicon added to the aluminum particles approached the eutectic point concentration of silicon in a bulk material, the aluminum particles would react with the added silicon and not the bulk silicon substrate. This was confirmed by the samples shown in FIG. 9 and FIG. 10. As the silicon concentration was further increased to approximately 30%, the local density of surface pitting on the bulk silicon wafer was greatly reduced. As the silicon particle concentration was increased to approximately 50%, the pitting was mostly eliminated. There was some residue on the surface, which was excess silicon that had not reacted with the aluminum.

The excess of silicon particles added to the paste required to eliminate the pitting due to the aluminum reaction with the silicon substrate was much beyond what was expected based upon the phase diagram in FIG. 4. This is a function of the reaction kinetics of the particle systems: because the silicon particles are separated from the aluminum particles, they cannot completely react until there is a large excess of silicon particles.

The results of the foregoing indicates that the concentration of silicon particles shifts the diffusion of aluminum. There is a significant reduction in silicon pitting with the addition of silicon panicles. If a sufficient quantity of silicon is available, the aluminum will uptake silicon from the silicon particles rather than the silicon wafer. The amount of diffusion may be controlled by manipulating the relative concentration of silicon particles.

Figure 15A:
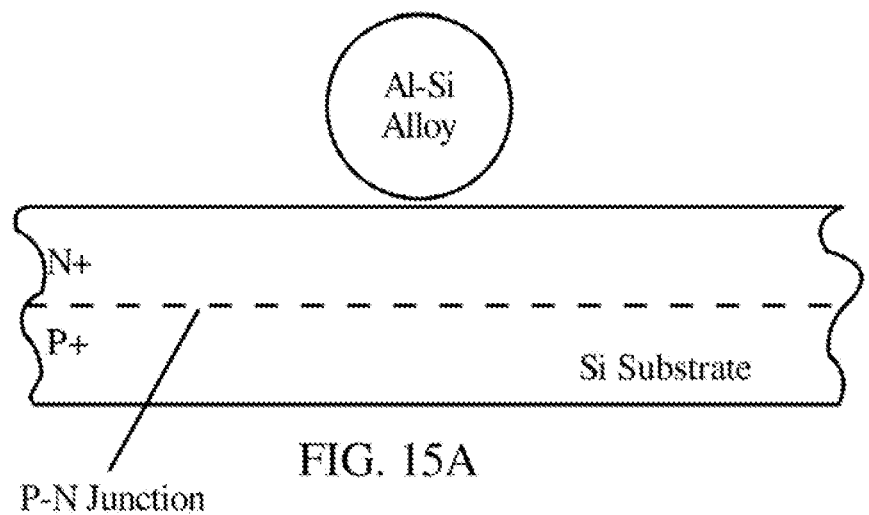
FIGS. 15A-15C illustrate schematics showing a shallow diffusion of aluminum through the P-N junction in a silicon substrate.
Figure 15B:
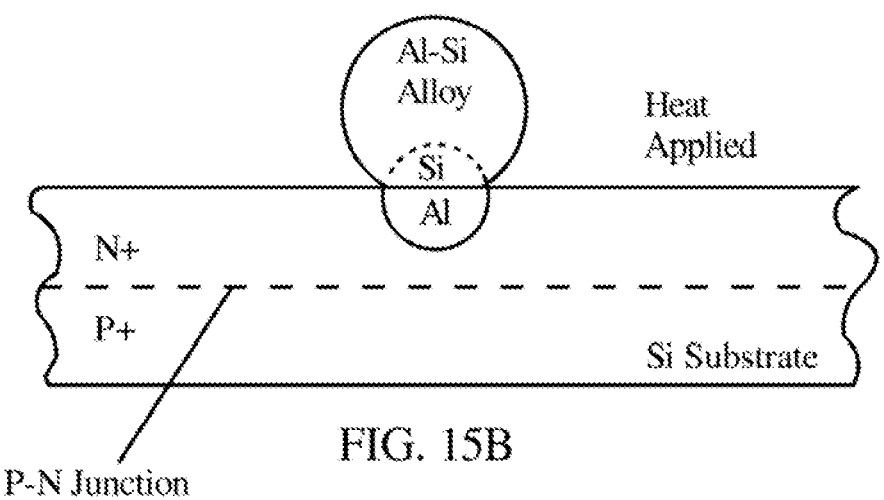
Figure 15C:
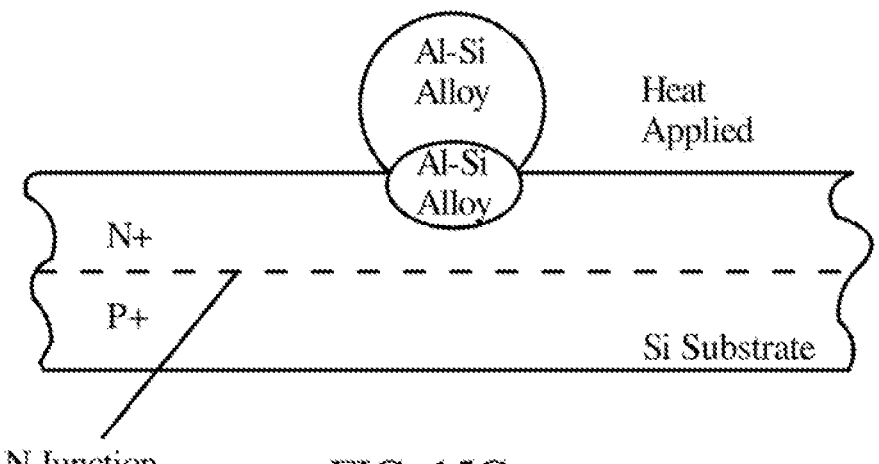

In embodiments of the present invention, a metallization material may be made using particles that are an alloy of aluminum and silicon. The location of silicon inside the particles reduces the total amount of silicon required to control diffusion. The addition of silicon in the aluminum particles removes a degree of reactivity in the particle. As already discussed, a standard aluminum paste creates large pits in the silicon due to silicon uptake. However, if the aluminum is pre-stabilized with silicon, upon heating (firing), the particle will form a contact with the silicon without rapid diffusion of aluminum into the silicon. This creates a very shallow doping effect when the contact is formed, and no pitting will occur. The concentration of silicon may be between approximately 4% and 12% in the aluminum-silicon alloy. Referring FIGS. 15A-15C, there is a schematic illustration showing how such aluminum-silicon alloy particles can enhance the manufacturing process for producing a shallow diffusion. In FIG. 15A, an aluminum-silicon ("Al—Si") alloy particle is deposited onto a silicon substrate, such as in an ink or paste formulation. Referring to FIG. 15B, as heat is applied, there is a diffusion of the aluminum and the silicon at the interface between the particle and the substrate. Referring to FIG. 15C, because the alloy particle is already an alloy of aluminum and silicon, very little diffusion takes place. A very thin contact layer is formed, but no diffusion into the bulk wafer occurs, thus preserving the integrity of the p-n junction.

In a controlled experiment, aluminum-silicon alloy particles with a nominal concentration of approximately 12% were made into a paste. Alloy particles of approximately 12% silicon in aluminum were obtained. The particle sizes were approximately 30-50 microns. These particles were formulated into a paste containing the metal alloy particles, inorganic components, solvents, dispersants, and/or vehicles components as is well known for making pastes (or inks). The paste was printed onto a crystalline silicon substrate and fired at approximately 550° C. The sample was not conductive after firing (i.e., no current would flow through the alloy particle film with an applied voltage using two contact probes). The particle size (30-50 microns) was much larger than the preferred particle size previously noted (<1 micron) confirming that they are too large to sinter at these sub-eutectic temperatures. Indeed, small particles are needed for low temperature sintering.

Figure 11:
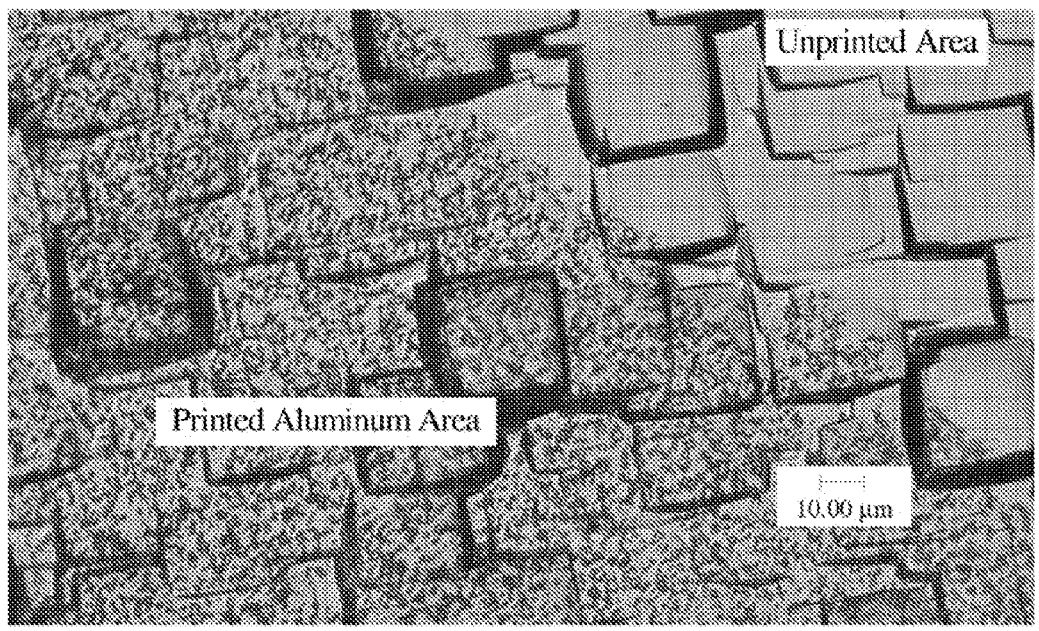
FIG. 11 is a digital image showing precipitation upon cooling after sintering.

Another paste was made using similar aluminum-silicon alloy particles (approximately 12% Si) with a sub-micron particle size distribution (the mean particle size was approximately 1 micron with all particles comprising as size less than 3 microns). This paste was printed onto a silicon substrate and fired at approximately 550° C. The sample sintered into a highly conducting film indicating significant particle melting and coalescence. The sheet resistance of the film measured less than 1 ohm/square, and in certain optimized samples, measured less than 0.1 ohm/square. After firing, the aluminum layer was etched from the surface. A small sample of the wafer was cleaved from the bulk wafer. The sample was immersed in an acidic aluminum etching solution (e.g., comprised of phosphoric and nitric acid) until the film was dissolved. The sample was then rinsed with copious amounts of high purity water and dried with a stream of dry nitrogen. The sample showed a residue left after removal of the aluminum, due to silicon precipitation from the aluminum silicon particles. The precipitation occurs upon cooling of the sample after sintering. The precipitation of material is shown in FIG. 11. This observation is confirmed by the phase diagram (see FIG. 4). The individual particles can have a larger concentration of silicon compared to the bulk material phase diagram. Their small shape puts them in a higher energy state that provides stabilization to the increased concentration of silicon. After sintering, the aluminum film acts as the bulk metallic film with diffusion concentrations that match the phase diagram for aluminum and silicon. The aluminum particles cannot support the high concentration of silicon at room temperature.

Figure 12:
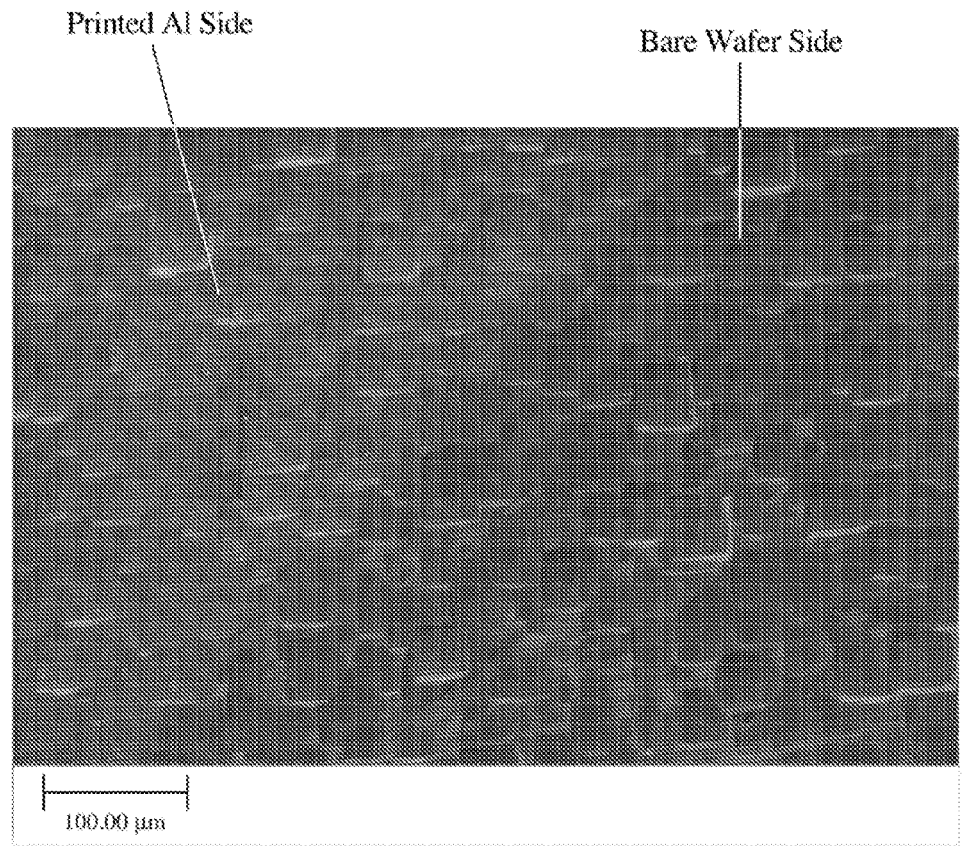
FIG. 12 is a digital image showing reduced pitting in the silicon after removal of the silicon residue.

The density of the residue was too high to confirm that the pitting was eliminated. Therefore, the silicon residue coated silicon wafer sample shown in FIG. 11 was then etched using HP acid to remove this silicon residue left from the removal of the aluminum-silicon alloy. The sample was immersed in dilute hydrofluoric acid for 45 seconds. The sample was then rinsed with copious amounts of high purity water and dried with as stream of dry nitrogen. Retelling to FIG. 12 (the Printed Al Side corresponds to the Printed Aluminum Area in FIG. 11; and the Bare Wafer Side corresponds to the Unprinted Area in FIG. 11), alter removal of the silicon residue, no pitting in the silicon was observed, confirming that the use of the aluminum-silicon alloy particles stabilizes the aluminum and prevents pitting.

Figure 13:
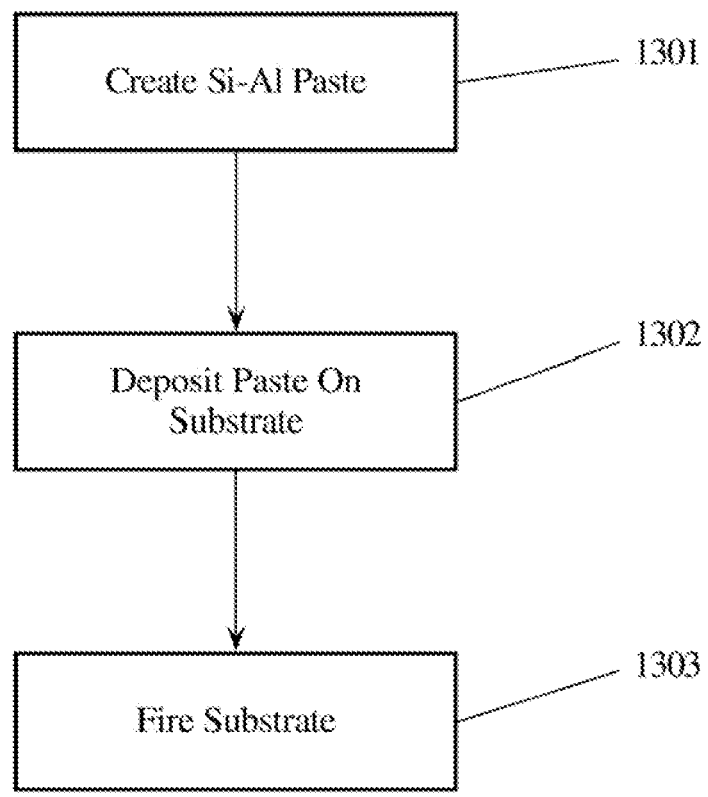
FIG. 13 illustrates a flow diagram of a process configured in accordance with the present invention.

In summary, referring to FIG. 13, embodiments of the present invention provide an improved process for metallization of the electrical contacts of electrodes for solar cells. In step 1301, an ink or paste comprising silicon and aluminum particles, or aluminum-silicon alloy particles, is created, along with the other various well-known materials utilized for the production of inks and pastes that are then deposited onto a substrate, such as using the various techniques disclosed herein. In step 1302, the ink or paste is then deposited onto the silicon substrate, and then in step 1303 the substrate is fired to an elevated temperature as described herein with respect to the various embodiments. The result is that the various solar cell structures shown in FIGS. 1-3 are produced with the improvements described herein.

In other embodiments, additional additives may be placed in the ink to further control the diffusion. For example, titanium nitride has been used as a barrier layer for silicon substrate metallization, including silicon solar cells. Titanium nitride makes a low resistance contact to silicon. (See Heung. Woontong Nathan (1980) I. Channeling studies of silicon interfaces. II. Diffusion barrier properties of titanium nitride. Dissertation (Ph.D.), California institute of Technology.) The metallization paste may incorporate titanium nitride nanoparticles that are substituted for the silicon nanoparticles. The TiN melts before the aluminum particles begin to soften. This creates a surface coating of TiN on the aluminum particles and the exposed silicon substrate not in contact with contacting metal particles in situ during the firing process. The coating serves as a barrier layer to metal diffusion in the silicon. The TiN may be in nanoparticle form that is then mixed with other metals to form a paste or ink. In another embodiment, metallic particles (such as aluminum, silver, copper, titanium, or nickel) may be coated with a thin layer of TiN forming a diffusion barrier to prevent the metallic particles from touching the silicon substrate.

What is claimed is:

1. A method of generating an interdigitated backside contact solar cell, comprising: generating at least one p-doped region and at least one n-doped region at a rear side of a silicon substance;
   depositing a first aluminum-silicon paste on the at least one p-doped region to form a first metallization layer; and
   depositing a second aluminum-silicon paste on the at least one n-doped region to form a second metallization layer, wherein each of the first aluminum-silicon paste and the second aluminum-silicon paste consists essentially a mixture of aluminum particles and silicon particles,
   wherein the silicon particles comprising nanoparticles having higher surface area, and are more reactive and having lower melting point than silicon particles of the silicon substance so that the nanoparticles react with the aluminum particles before the aluminum particles react with the silicon particles of the silicon substance, and
   configured to reduce a depth of aluminum diffusion into the silicon substance and forming an aluminum-silicon alloy layer partially extending into the silicon substance.

2. The method of claim 1, wherein the first aluminum-silicon paste and the second aluminum-silicon paste are deposited at the same time on the at least one p-doped region and the at least one n-doped region.

3. The method of claim 1, wherein the silicon substance further comprises an antireflective coating at a front side of the silicon substance.

4. The method of claim 1, wherein the at least one p-doped region and the at least one n-doped region form an alternating pattern.

5. The method of claim 1, wherein the at least one p-doped region and the at least one n-doped region are configured to interconnect with the silicon substance to form PN junctions.

6. The method of claim 1, wherein silicon concentration in the mixture of aluminum particles and silicon particles ranges from 4%-12%.

7. The method of claim 1, wherein a diameter size of the aluminum particles is less than 250 nm.

8. The method of claim 1, further comprising:
   heating the first aluminum-silicon paste on the at least one p-doped region and the second aluminum-silicon paste on the at least one n-doped region to a predetermined range of temperature.

9. The method of claim 8, wherein the predetermined range of temperature is approximately 550° C.

10. The method of claim 8, wherein the predetermined range of temperature is less than 660° C.

11. A method of generating an interdigitated backside contact solar cell, comprising: depositing a first aluminum-silicon paste on at least one p-doped region at a rear side of a silicon substance;
    depositing a second aluminum-silicon paste on at least one n-doped region at the rear side of the silicon substance;
    forming a first metallization layer on the at least one p-doped region; and
    forming a second metallization layer on the at least one n-doped region, wherein each of the first aluminum-silicon paste and the second aluminum-silicon paste consists essentially a mixture of aluminum particles and silicon particles, wherein the silicon particles comprising nanoparticles having higher surface area, and are more reactive and having lower melting point than silicon particles of the silicon substance so that the nanoparticles react with the aluminum particles before the aluminum particles react with the silicon particles of the silicon substance, and configured to reduce a depth of aluminum diffusion into the silicon substance and forming an aluminum-silicon alloy layer partially extending into the silicon substance.

12. The method of claim 11, wherein the first aluminum-silicon paste and the second aluminum-silicon paste are deposited at the same time on the at least one p-doped region and the at least one n-doped region.

13. The method of claim 11, wherein the silicon substance further comprises an antireflective coating at a front side of the silicon substance.

14. The method of claim 11, wherein the at least one p-doped region and the at least one n-doped region form an alternating pattern.

15. The method of claim 11, wherein the at least one p-doped region and the at least one n-doped region are configured to interconnect with the silicon substance to form PN junctions.

16. The method of claim 11, wherein silicon concentration in the mixture of aluminum particles and silicon particles ranges from 4%-12%.

17. The method of claim 11, wherein a diameter size of the aluminum particles is less than 250 nm.

18. The method of claim 11, further comprising:
    heating the first aluminum-silicon paste on the at least one p-doped region and the second aluminum-silicon paste on the at least one n-doped region to a predetermined range of temperature.

19. The method of claim 18, wherein the predetermined range of temperature is approximately 550° C.

20. The method of claim 18, wherein the predetermined range of temperature is less than 660° C.

* * * * *